United States Patent [19]

Erhardt et al.

[11] Patent Number: 5,070,380
[45] Date of Patent: Dec. 3, 1991

[54] TRANSFER GATE FOR PHOTODIODE TO CCD IMAGE SENSOR

[75] Inventors: Herbert J. Erhardt, Rochester; Edward T. Nelson, Pittsford; Eric G. Stevens, Rochester, all of N.Y.

[73] Assignee: Eastman Kodak Company, Rochester, N.Y.

[21] Appl. No.: 566,934

[22] Filed: Aug. 13, 1990

[51] Int. Cl.[5] .................... H01L 29/78; H01L 27/14; H01L 31/00
[52] U.S. Cl. ......................................... 357/24; 357/30
[58] Field of Search ..................................... 357/24, 30

[56] References Cited

U.S. PATENT DOCUMENTS

| 4,032,952 | 6/1977 | Ohba et al. | 357/24 M |
| 4,151,539 | 4/1979 | Barron et al. | 357/24 M |
| 4,724,470 | 2/1988 | Van Santen et al. | 357/24 M |

Primary Examiner—Gene M. Munson

[57] ABSTRACT

An image sensor formed on a P-type substrate includes a plurality of pinned diode photodiodes, a CCD shift register and a separate buried transfer gate located between each of the photodiodes and the CCD shift register. The photodetectors are arranged in at least one line. The CCD shift register extends along the line of photodetectors. Each of the pinned diode photodetectors includes a first region of N-type conductivity in the substrate and a second region of P+ type conductivity in the first region and along the substrate surface. The CCD shift register includes a channel region of N-type conductivity in the substrate surface and two sets of conductive gates along the channel region and insulated from the substrate surface. Each transfer gate includes a transfer channel region of N-type conductivity in the substrate and extending along the substrate surface from the shift register channel region to the first region of its respective photodetector. Each gate of one of the sets of shift register gates may have a portion which extends over the transfer gate channel region.

14 Claims, 4 Drawing Sheets

TRANSFER GATE FOR PHOTODIODE TO CCD IMAGE SENSOR

FIELD OF THE INVENTION

The present invention relates to a buried channel transfer gate for an image sensor which includes a photodetector and a CCD shift register, and, more particularly, to a buried channel transfer gate between a pinned diode photodetector and a CCD shift register of an image sensor.

BACKGROUND OF THE INVENTION

One type of solid state image sensor includes a substrate of a semiconductor material, such as single crystalline silicon, having along a surface thereof a plurality of detector areas, such as photodetectors, for detecting radiation and converting the radiation to charge carriers, and transfer means along the detectors for receiving the charge carriers and transferring them to an output terminal. One type of transfer means commonly used is a charge-coupled device (CCD) shift register. Although various types of photodetectors have been used, such as PN diode detectors and Schottky barrier junction detectors, one type which has been found to have certain advantages is a pinned diode. As shown in FIGS. 12, 13 and 14 of U.S. Pat. No. 4,527,182 (Y. Ishihara et al., issued July 2, 1985), entitled "Semiconductor Photoelectric Converter Making Excessive Charge Flow Vertically", a pinned diode comprises a region of N-type conductivity in the surface of the substrate and a region of highly conductive P-type conductivity, generally referred to as P+ type conductivity, in the N-type region and along the surface of the substrate.

One problem which arises when using a pinned diode as the photodetector occurs at the transfer gate between the pinned diode and the CCD shift register. Generally, the transfer gate is a surface channel type gate. A surface channel type gate comprises a region of the substrate, which is generally of P-type conductivity, between an edge of the pinned diode and the buried channel of the CCD shift register forming a transfer channel, and a conductive gate over the transfer channel and insulated there from, generally by a layer of silicon dioxide. In forming a pinned diode, the P+ type region has a tendency to diffuse fully across the N-type region and into the transfer channel of the transfer gate. This results in the formation of a channel potential barrier between the pinned diode and the transfer gate which is higher than that of the balance of the transfer gate channel potential. This type of spurious barrier can result in image lag and increased noise, and thereby reduce the overall image quality. Therefore, it would be desirable to have a transfer gate between a pinned diode photodetector and a CCD shift register of an image sensor which eliminates these problems. Although other types of transfer gates have been used between the photoconductors and a CCD shift register of an image sensor, such as a buried channel transfer gate shown in U.S. Pat. No. 4,774,557 (W. F. Kosonocky, issued Sept. 27, 1988), entitled "Back-Illuminated Semiconductor Imager With Charge Transfer Devices in Front Surface Well Structure", such gates have not been used with pinned diode photodetectors.

SUMMARY OF THE INVENTION

The present invention is directed to a solid state image sensor which comprises a pinned diode image sensor, a CCD shift register adjacent to but spaced from the pinned diode, and a buried channel transfer gate located between the pinned diode and the channel region of the CCD shift register. The buried channel transfer gate greatly reduces any potential barriers between the pinned diode and the CCD which can result in image lag and increased noise and reduces the effects of charge pumping in an area array where the gate is connected to one of the CCD gates.

More particularly, the present invention is directed to an image sensor which comprises a substrate of a semiconductor material of one conductivity type having a surface. A pinned diode photodetector is in the substrate at its surface. The pinned diode includes a first region of a conductivity type opposite to that of the substrate in the substrate and includes a highly conductive second region of the same conductivity type as the substrate in a portion of the first region and extending to the substrate surface. A CCD is in the substrate spaced from the pinned diode. The CCD includes a buried channel region of the opposite conductivity type. A transfer gate is between the channel of the CCD and the pinned diode and includes a transfer channel region in the substrate of the opposite conductivity type.

The invention will be better understood from the following more detailed description taken with the accompanying drawings and claims.

Figure 1:
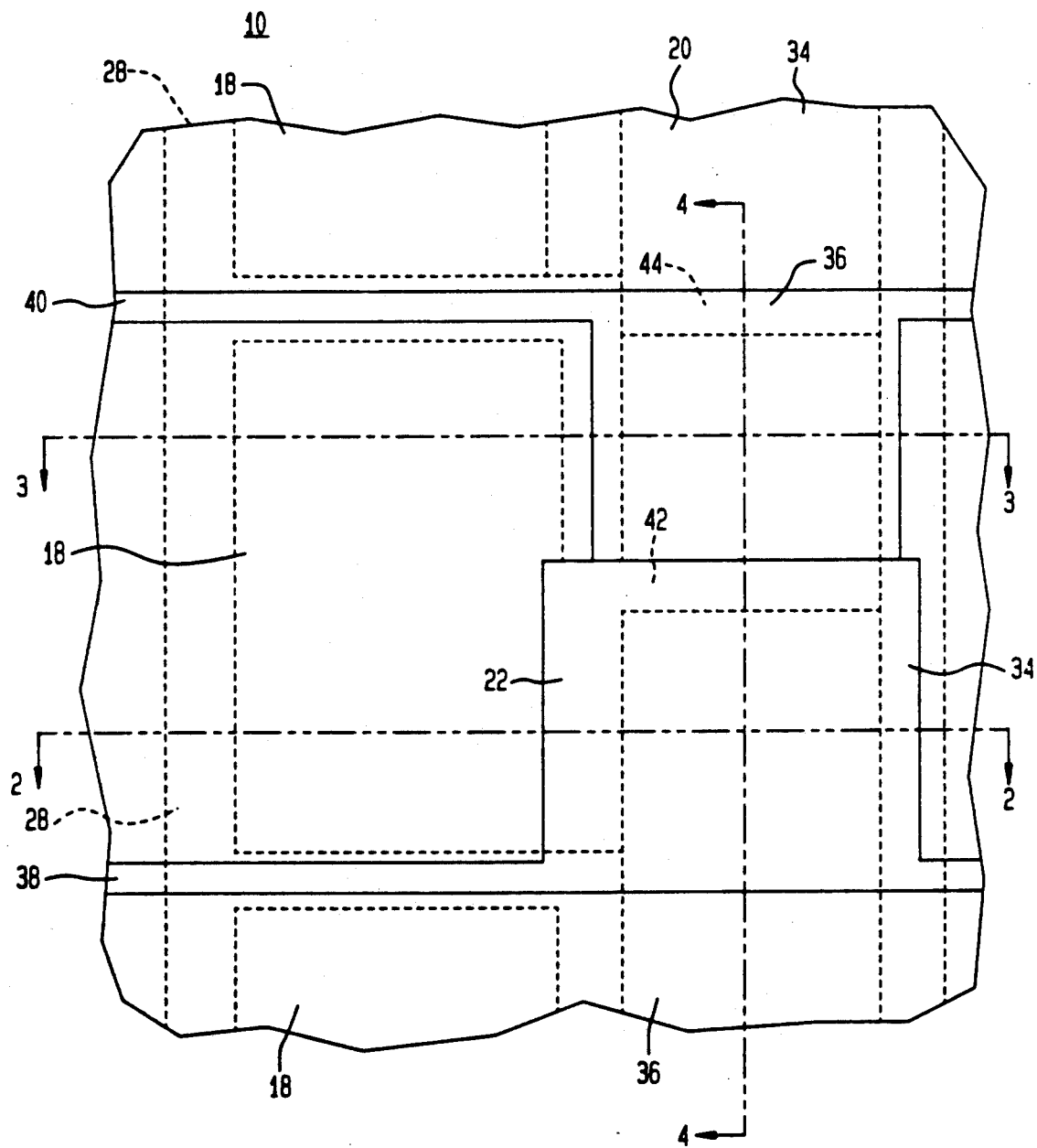
FIG. 1 is a top plane view of a portion of a solid state image sensor array which includes the transfer gate of the present invention.

It should be understood that the figures of the drawing are not necessarily drawn to scale.

DETAILED DESCRIPTION

Figure 2:
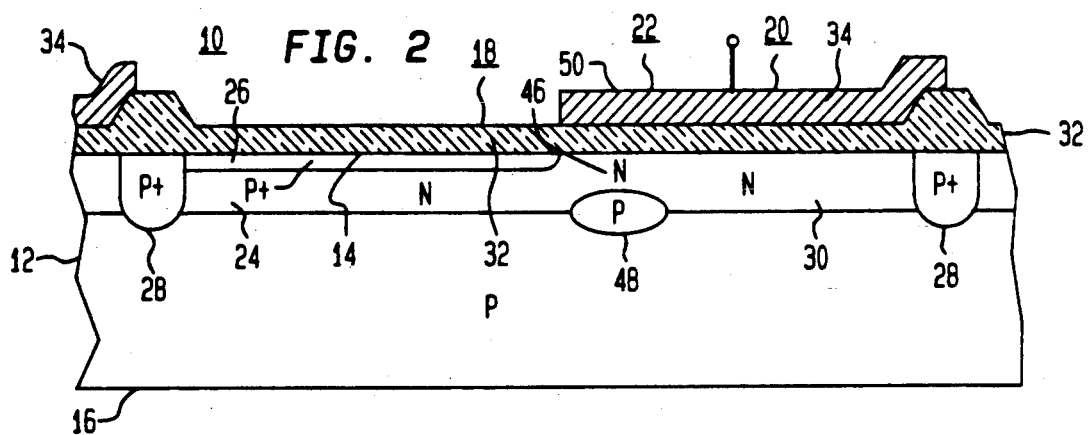
FIG. 2 is a sectional view taken along line 2—2 of FIG. 1.
Figure 3:
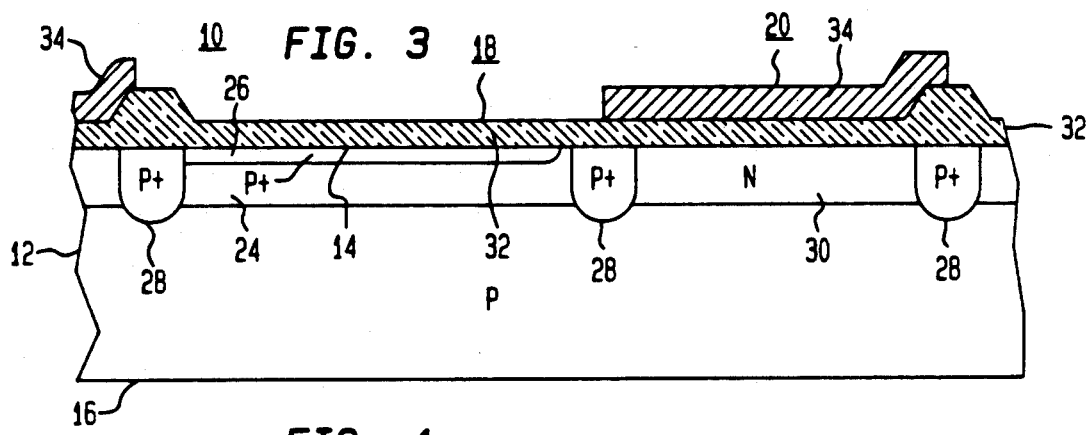
FIG. 3 is a sectional view taken along line 3—3 of FIG. 1.
Figure 4:
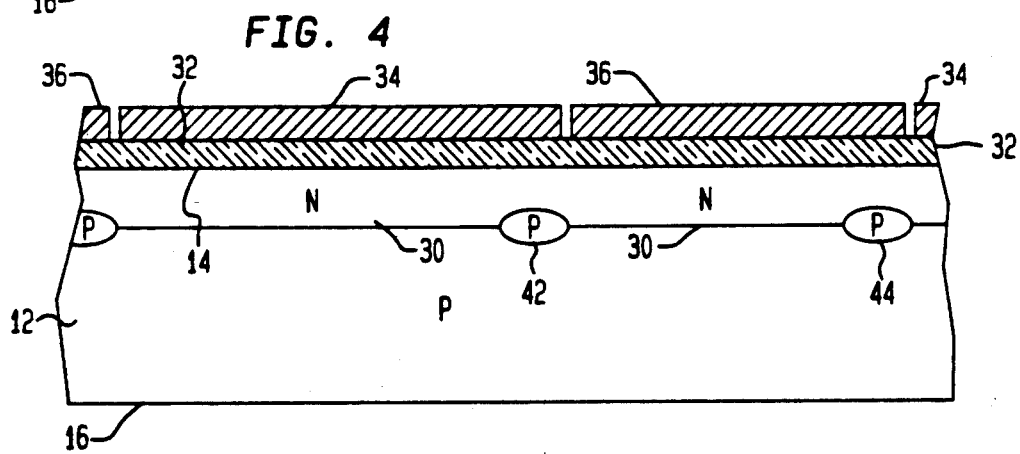
FIG. 4 is a sectional view taken along line 4—4 of FIG. 1.

Referring now to FIGS. 1-4, there is shown a portion of an image sensor 10 in accordance with the present invention. FIG. 1 shows a top plan view of the image sensor 10 and FIGS. 2-4 show different sectional views taken through dashed lines 2—2, 3—3, and 4—4, respectively of the image sensor 10. Image sensor 10 comprises a substrate 12 of a semiconductor material, such as single crystalline silicon, of one conductivity type (shown as P-type) having in a typical embodiment a concentration of about $10^{15}$ atoms/cm$^3$. The substrate 12 has a pair of opposed surfaces 14 and 16. In the substrate 12 along the surface 14 are a plurality of photodetectors 18, only one of which is completely shown. The photodetectors 18 are arranged in an array which can be either a line array, in which the photodetectors are in a row, or an area array, in which the photodetectors are arranged in spaced rows and columns. Along each row, in a line array, or each column, in an area array, of the photodetectors 18 is a CCD shift register 20. Between each of the photodetectors 18 and its adjacent CCD shift register 20 is a transfer gate 22. The photodetectors 18 are adapted to receive light from the image and convert the light to charge carriers. The charge carriers are transferred to the CCD shift register 20 through the transfer gate 22. The CCD shift register 20 then transfers the charge carriers to an output circuit, not shown.

As shown in FIGS. 2 and 3, each of the photodetectors 18 is a pinned diode photodetector. The pinned diode photodetector 18 comprises a first region 24 of N-type conductivity having an impurity concentration of about $10^{17}$ atoms/cm$^3$, in the substrate 12 at the surface 14. Within a portion of the first region 24 is a second region 26 of highly conductive P-type conductivity (shown as P+ type) having an impurity concentration of about $10^{18}$ atoms/cm$^3$. The second region 26 is shallower than the first region 24 and extends along the substrate surface 14. Partially surrounding each of the pinned diode photodetectors 18 is a channel stop 28. As shown in FIGS. 2 and 3, the channel stop 28 is a region of highly conductive P-type conductivity (shown as P+ type) and having an impurity concentration of about $10^{18}$ atoms/cm$^3$, extending into the substrate 12 from the surface 14. Along the side of the pinned diode photodetector 18 adjacent the CCD shift register 20, the channel stop 28 has an opening through which the transfer gate 22 extends.

Each of the CCD shift registers 20 is a buried channel CCD having a channel region 30 of N-type conductivity within the substrate 12 and extending along the surface 14. The channel region 30 has an impurity concentration of about $10^{17}$ atoms/cm$^3$. The channel region 30 extends along one side of all of the photodetectors 18 in a row or column and is spaced therefrom by a channel stop 28. A layer 32 of an insulating material, typically silicon dioxide, is on the substrate surface 14 and extends over the channel region 30 as well as the photodetectors 18 and the transfer gates 22. First and second sets of conductive gates 34 and 36 are on the insulating material layer 32 and over the channel region 30. Each of the first set of gates 34 extends along a portion of each photodetector 18 and each of the second set of gates 36 extends along the remaining portion of each photodetector 18. In an area array, each of the first set of gates 34 is electrically connected to corresponding gates of the other CCD shift registers by a connecting strip 38 (shown only in FIG. 1). Likewise, each of the second set of gates 36 is electrically connected to corresponding gates of the other CCD shift registers by a connecting strip 40 (shown only in FIG. 1). Each of the conductive gates 34 and 36 and their connecting strips 38 and 40 are typically of doped polycrystalline silicon. As shown in FIGS. 1 and 4, narrow barrier regions 42 and 44 of P-type conductivity extend into the substrate 12 and across the channel region 30. The barrier region 42 extends across an edge of a gate of the first set of conductive gates 34 and the barrier region 44 extends across an edge of the gate of the second set of conductive gates 36.

Each of the transfer gates 20 is a buried channel transfer gate which comprises a transfer channel region 46 of N-type conductivity within the substrate 12 and at the surface 14. As shown in FIG. 2, the transfer channel region 46 extends between the CCD channel 30 and the N-type region 24 of the pinned diode photodetector 18. As shown in FIG. 1, the transfer channel region 46 extends through the opening in the channel stop 28. Along the junction of the transfer channel region 46 and the substrate 12 is a barrier region 48 of P-type conductivity, typically having an impurity concentration of about $10^{16}$ atoms/cm$^3$. Each barrier region 48 is self aligned to the transfer gate edge or extends into the entire diode region (as in FIG. 5) to avoid barrier or well occurrence and may be connected to the barrier region 42 extending under the adjacent gate of the first set of gates 34. Each of the first set of gates 34 has a portion 50 which extends over the transfer channel region 46.

In the operation of the image sensor 10, light impinging on the photodetectors 18 from an image is converted to charge carriers in the photodetectors 18. During the integration period the charge carriers are collected in the photodetectors. During a transfer period, a pulse is applied to the first set of conductive gates 34 and to the portion 50 of gate 34 which extends over the transfer channel region 46. This pulse is high enough to lower the potential barrier in the transfer channel region 46 enough to allow the charge in the photodetectors to flow through the transfer channel region 46 to the CCD channel 30 under the first set of conductive gates 34. This voltage is also sufficient to completely deplete the photodiode of carriers (e.g., electrons) by raising the channel potential in the transfer channel region 46 beyond the pinning potential of the photodiode region. The two sets of conductive gates 34 and 36 are then pulsed alternately to cause the charge to flow from under one set of gates to under the next set of gates and thereby flow along the channel region 30 of the CCD shift register 20 to an output circuit, not shown. The pulses applied to the conductive gates 34 and 36 to transfer the charge along the CCD shift register 20 are lower than that applied to the first set of gates 34 to transfer the charge from the photodetectors 18 to the channel region 30 of the CCD shift register 20. Thus, while the charge is being transferred along the CCD shift register 20, the potential barrier provided in the transfer channel region 46 of each transfer gate 22 is high enough to prevent any charge being collected in the photodetectors 18 from flowing into the channel region 30 of the CCD shift register 20.

By using a buried channel transfer gate 22 in the image sensor 10 of the present invention, the transfer gate channel region 46 is of the same conductivity type as the first region 24 of the pinned diode photodetector 18. Thus, effects from lateral diffusion of the P+ type second region 26 of the pinned diode photodetector 18 into the transfer channel region 46 are suppressed by the compensating nature of the n-type dopant in this region. As a result, spurious barriers at the transfer region edges are eliminated. It is noted that an alternate implementation could employ a separate conductive gate, typically of polysilicon, which would serve as the transfer gate. The doping concentration and operating levels would be the same as the above case with the exception that a separate clock would be required to drive the separate transfer gate.

Figure 6:
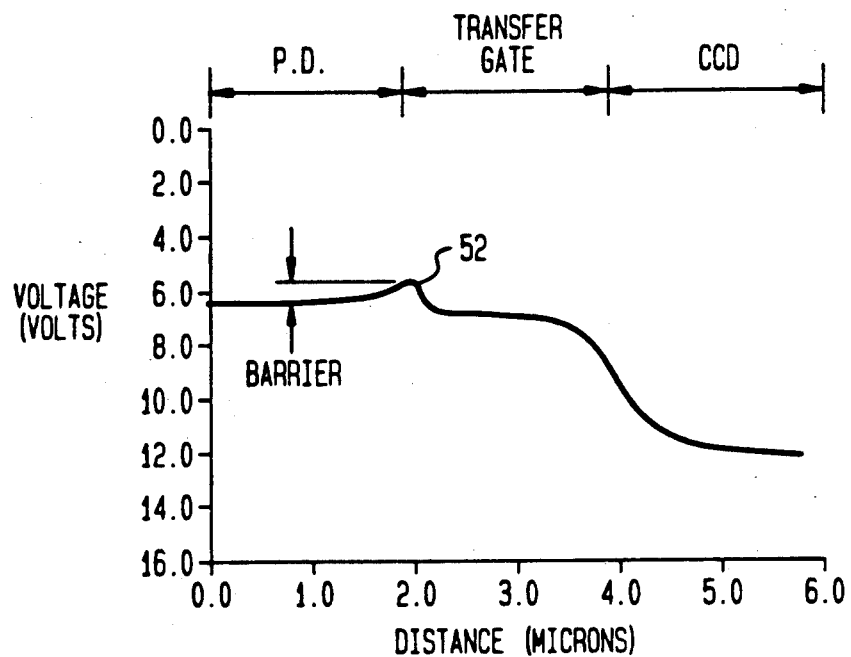
FIG. 6 is a diagram showing the electrostatic potentials along an image sensor of the prior art using a surface channel transfer gate between a pinned diode and a CCD shift register.

Referring now to FIG. 6, there is graphically shown a diagram of voltage (volts) on the y-axis in the portions of an image array vs. distance (microns) on the x-axis along the image array for an image array using a prior art surface channel transfer gate. It can be seen that there is developed an undesirable potential barrier at a point 52 on the diagram (curve) where the pinned diode photodetector and the transfer gate meet.

Figure 7:
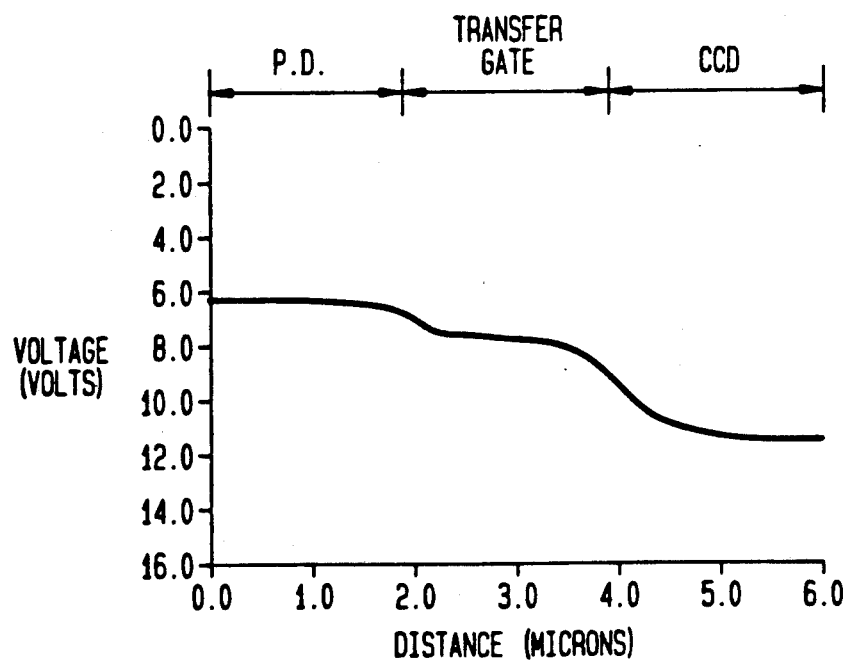
FIG. 7 is a diagram showing the electrostatic potentials along an image sensor of the present invention using a buried channel transfer gate.

Referring now to FIG. 7, there is graphically shown a diagram of voltage (volts) on the y-axis in the portions of an image array vs. distance (microns) on the x-axis along the image sensor 10 which comprises a buried channel transfer gate. It can be seen from FIG. 7 that there is no such barrier where the pinned diode and the transfer gate meet. Thus, the image sensor 10 of the present invention reduces any potential barriers between the photodiode 18 and the CCD shift register 20 so as to prevent image lag and eliminate KTC and 1/f noise and thereby maintain overall image quality.

Figure 8:
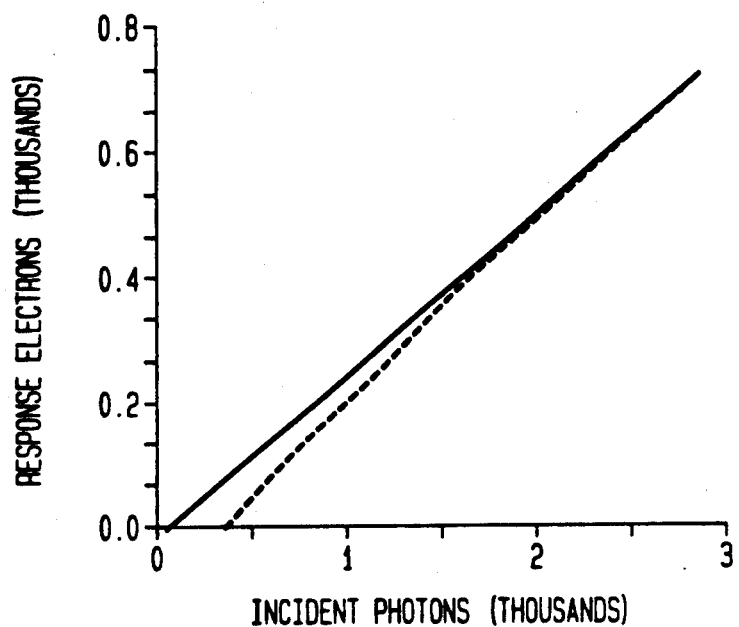
FIG. 8 is a diagram showing the charge loss resulting from charge pumping effects in an image sensor of the prior art using a surface channel transfer gate and of the image sensor of the present invention using a buried channel transfer gate.

Referring now to FIG. 8, there is graphically shown the photoresponse of a prior art image sensor having a surface channel transfer gate (the dashed line curve) and an image sensor 10 of the present invention having a buried channel transfer gate (the solid line curve), respectively. On the y-axis is shown response electrons (thousands) and on the x-axis is shown incident photons (thousands). As can be seen in FIG. 8, the photoresponse is shifted down for the case of the prior art image sensor (the dashed line curve) and indicates a fixed charge loss. This charge loss is a result of charge pumping. Charge pumping is a result of defects at the substrate surface which cause traps for charge carriers when a potential is applied thereto. Thus, in a surface channel transfer gate, when a potential is applied thereto to cause the charge carriers to flow from the photodetector to the CCD shift register, some of the charge carriers become caught in these traps and are subsequently lost when they recombine with holes as the gates are brought into accumulation. However, as can also be seen in FIG. 8, the image sensor 10 (the solid curve) of the present invention has a linear response intercepting the y-axis response axis at zero incident photons, indicating no signal loss. This reduction in charge pumping is a result of the transverse electric field realized in the buried channel transfer gate which repels charge carriers away from the interface between the silicon substrate and the silicon dioxide insulating layer where the loss normally occurs.

Figure 9:
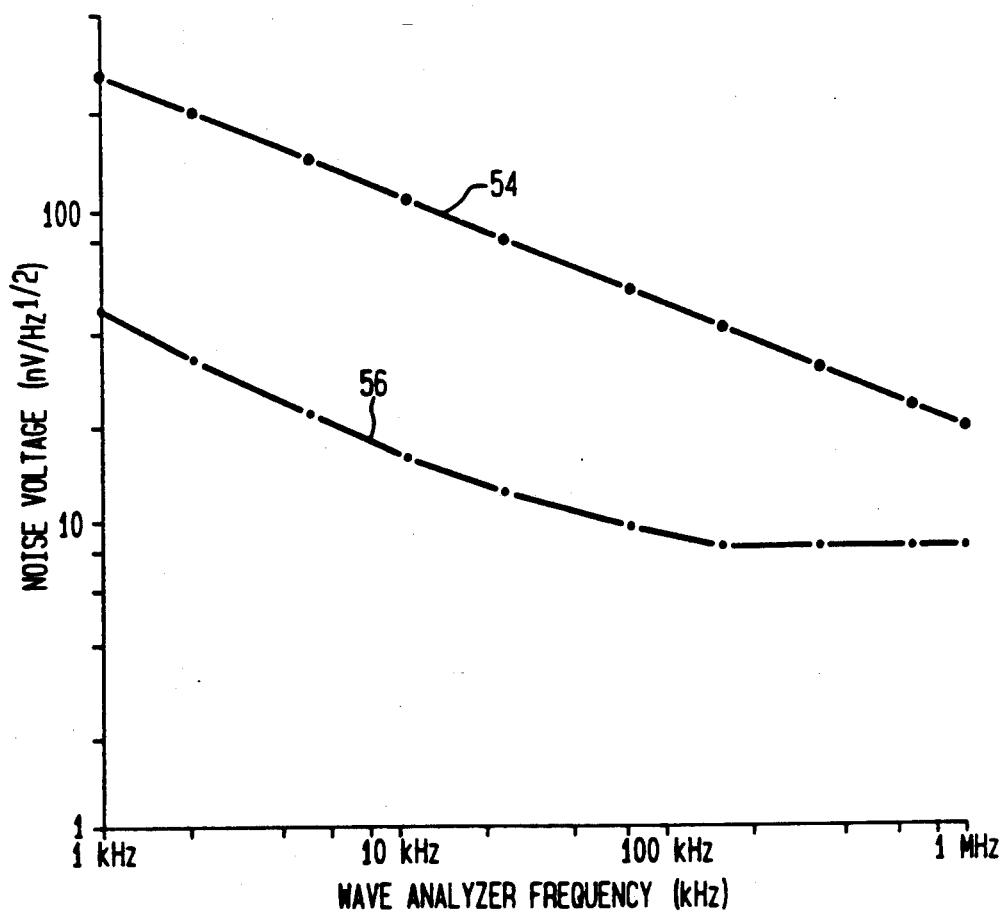
FIG. 9 is a diagram comparing the 1/f noise for image sensor arrays having surface channel transfer gates and buried channel transfer gates.

Another advantage which results from the repelling of the charge carriers away from the interface between the silicon substrate and the silicon dioxide insulating layer is shown in FIG. 9.

Figure 5:
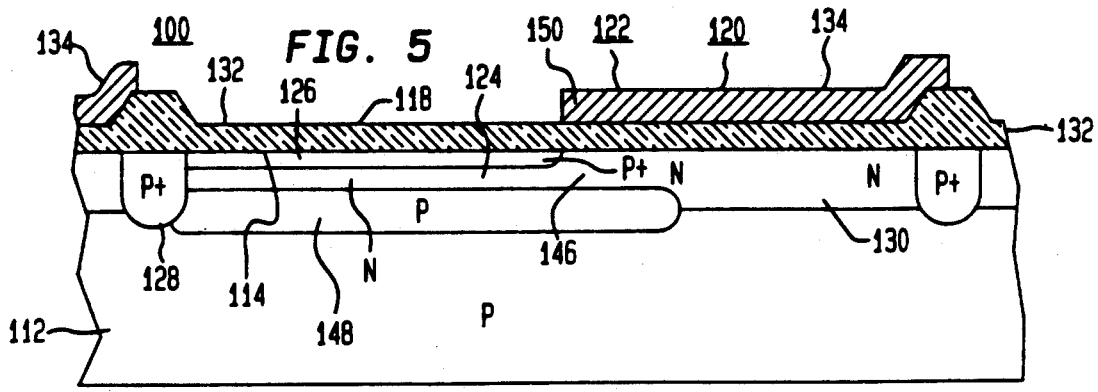
FIG. 5 is a sectional view similar to FIG. 2 of a modification of the image sensor of the present invention.

Referring now to FIG. 9, there is graphically shown noise voltage (on the y-axis) versus frequency (on the x-axis) for a prior art surface type image sensor which has a surface channel transfer gate (curve 54) and for the image sensors 10 of FIG. 1 and 100 of FIG. 5 (curve 56) which each have a buried channel transfer gate. It can be clearly seen from FIG. 10 that the image sensors 10 and 100 of the present invention, which have buried-channel transfer gates, have much lower 1/f noise than the prior art image sensor which has a surface channel transfer gate.

Referring now to FIG. 5, there is shown a cross-sectional view of an image sensor 100 in accordance with another embodiment of the present invention. The image sensor 100 is similar in construction to the image sensor 10 shown in FIGS. 1-4. Image sensor 100 comprises a substrate 112 of single crystalline silicon having at a surface 114, a plurality of photodetectors 118, at least one CCD shift register 120 and a buried channel transfer gate 122 between the photodetectors 118 and the CCD shift register 120. The photodetector 118 is a pinned diode photodetector which comprises a first region 124 of N-type conductivity and a second region 126 of P+ type conductivity located within a portion of the first region 124. The CCD shift register 120 comprises a buried channel 130 of N-type conductivity and two sets of conductive gates, only the one set of gates 134 being shown, over the channel region 130 and insulated therefrom by an insulating layer 132 of silicon dioxide. The transfer gate 122 comprises a buried channel transfer region 146 of N-type conductivity between the CCD shift register channel 130 and the first region 124 of the pinned diode photodetector 118, and includes a portion 150, of the conductive gate 134 extending over the buried channel transfer region 146.

The image sensor 100 differs from the image sensor 10 in that the barrier region 148 along the interface between the substrate 112 and the buried channel transfer region 146 also extends under the pinned diode photodetector 118 along the interface of the substrate 112 and the first region 124 of the photodetector 118. This implantation eliminates a second P-N junction and the photodiode to transfer gate edge and thereby relaxes alignment tolerance of the P-type layer 148 in device manufacture.

Thus, there is provided by the present invention an image sensor having pinned diode photodetectors, CCD shift registers and a buried channel transfer gate between the photodetectors and the CCD shift register. The buried channel transfer gate provides the image sensor with the advantages of reducing the possibility of an extraneous potential barrier at the junction of the pinned diode and the transfer gate so as to eliminate the possibility of image lag and also reduces noise. Also, it improves the photoresponse linearity by reducing the effects of charge pumping.

It is to be appreciated and understood that the specific embodiments of the invention are merely illustrative of the general principles of the invention. Various modifications may be made consistent with the principles set forth. For example, although the image sensor of the present invention is shown as having only a single complete photodetector, it comprises a plurality of photodetectors arranged in some desired array, such as a row of the photodetectors for a linear array, or a plurality of photodetectors arranged in rows and columns for an area array. Still further, although only a portion of one CCD shift register is shown, the shift register extends along all of the photodetectors in the row of a linear array, or a separate CCD shift register is provided along each column of photodetectors in an area array. Still further, although two polysilicon CCD electrodes are shown adjacent to each photodiode, an interlaced version with a single electrode adjacent each photodiode and alternating photodiodes would be read out during each field. Still further, the image sensor of the present invention can be manufactured in a P-type conductivity well located in an N-type conductivity substrate. Furthermore, the conductivity types of the substrate and other regions of the image sensor of the present invention can be reversed. In such an embodiment the substrate 12 is of N-type conductivity.

What is claimed is:

1. An image sensor comprising:
   a substrate of a semiconductor material of one conductivity type having a surface;
   a pinned diode photodetector in said substrate at said surface, said diode having a first region of a conductivity type opposite that of the substrate in the substrate and having a highly conductive second region of the same conductivity type as the substrate in a portion of the first region and extending to the surface;
   a CCD shift register in said substrate spaced from the pinned diode, said CCD shift register including a buried channel region of the opposite conductivity type, first and second conductive gates over the shift register channel region and insulated from the surface of the substrate, the first conductive gate extending along a portion of the adjacent photodetector and the second gate extending along the remaining portion of the adjacent photodetector;
   a transfer gate between the channel region of the CCD shift register and the pinned diode including a channel region of the opposite conductivity type in said substrate and an extension of the first conductive gate extending over the transfer gate channel region to the edge of the pinned diode; and
   a barrier region of the one conductivity type extending along the transfer gate channel region.

2. The image sensor of claim 1 further comprising additional barrier regions of the one conductivity type in the substrate and extending across the CCD shift register channel region under an edge of each of the conductive gates.

3. The image sensor of claim 2 further comprising a highly conductive channel stop region of the one conductivity type around the photodetector, said channel stop having an opening thereacross along the one conductive gate of the CCD shift register, and the transfer gate extends through said opening.

4. The image sensor of claim 3 in which the one conductivity type is P-type and the opposite conductivity type is N-type.

5. The image sensor of claim 4 in which the substrate is of single crystalline silicon.

6. The image sensor of claim 1 in which the barrier region also extends along the interface of the first region of the pinned diode and the substrate.

7. An image sensor comprising:
   a substrate of a single crystalline silicon of one conductivity type having a surface;
   a plurality of pinned diode photodetectors in said substrate and arranged in spaced relation in a line, each of the photodetectors having a first region of a conductivity type opposite to that of the substrate in the substrate and having a second region of the same conductivity type as the substrate in a portion of the first region and extending to the substrate surface;
   a CCD shift register in said substrate and including a buried channel region of the opposite conductivity type extending along the line of photodetectors and spaced therefrom, first and second sets of conductive gates over the shift register channel region and insulated from the substrate surface, each of the first conductive gates extending along a portion of its adjacent photodetector and each of the second conductive gates extending along the remaining portion of a separate one of the photodetectors;
   a transfer gate between each of the photodetectors and the channel region of the CCD shift register, each of the transfer gates including a channel region of the opposite conductivity type in said substrate between the first region of the photodetector and the CCD shift register channel region and an extension of the first gate extending over the adjacent transfer gate channel region to the adjacent photodetector; and
   a barrier region of the one conductivity type extending along the interface of each of the transfer gate channel regions and the substrate.

8. The image sensor of claim 7 further comprising additional barrier regions of the one conductivity type in the substrate and extending across the CCD shift register channel region, each of the additional barrier regions extending under an edge of a separate one of each of the conductive gates.

9. The image sensor of claim 8 in which the additional barrier region under each of the one set of gates is connected to the barrier region under the adjacent transfer gate.

10. The image sensor of claim 9 further comprising a highly conductive channel stop region of the one conductivity type in said substrate and extending around each of the photodetectors, said channel stop region having openings thereacross along each of the one set of conductive gates and each transfer gate extends through one of said openings.

11. The image sensor of claim 10 in which the one conductivity type is P-type and the opposite conductivity type is N-type.

12. The image sensor of claim 11 in which each of the barrier regions additionally extends along the interface of the one region of the adjacent pinned diode photodetector and the substrate.

13. The image sensor of claim 12 in which the one conductivity type is P-type and the opposite conductivity type is N-type.

14. The image sensor of claim 13 in which each of the barrier regions additionally extends along the interface of the one region of the adjacent pinned diode photodetector and the substrate.

* * * * *